(12) United States Patent
Jou et al.

(10) Patent No.: US 10,371,904 B2
(45) Date of Patent: Aug. 6, 2019

(54) OPTICAL COUPLING STRUCTURES

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

(*) Notice: Subject to any disclaimer, the term of this patent is extended or adjusted under 35 U.S.C. 154(b) by 0 days.

(21) Appl. No.: 15/964,889

(22) Filed: Apr. 27, 2018

(65) Prior Publication Data

US 2018/0335585 A1 Nov. 22, 2018

Related U.S. Application Data

(60) Provisional application No. 62/508,940, filed on May 19, 2017, provisional application No. 62/509,892, filed on May 23, 2017.

(51) Int. Cl.
*G02B 6/42* (2006.01)
*G02B 6/12* (2006.01)
*H04B 10/25* (2013.01)
*H04B 10/50* (2013.01)
*H04B 10/67* (2013.01)
(Continued)

(52) U.S. Cl.
CPC ........ *G02B 6/4214* (2013.01); *G02B 6/12011* (2013.01); *G02B 6/3652* (2013.01); *G02B 6/425* (2013.01); *G02B 6/4206* (2013.01); *G02B 6/428* (2013.01); *G02B 6/4212* (2013.01); *G02B 6/4259* (2013.01); *G02B 6/4279* (2013.01); *H04B 10/25* (2013.01); *H04B 10/506* (2013.01);
(Continued)

(58) Field of Classification Search
CPC ..... G02B 6/4206; G02B 6/4212; G02B 6/425
USPC .......................................................... 385/33
See application file for complete search history.

(56) References Cited

U.S. PATENT DOCUMENTS 5,282,080 A   1/1994  Scifres et al.
5,416,861 A   5/1995  Koh et al.
(Continued)

OTHER PUBLICATIONS

WIPO Application No. PCT/US2018/031335, PCT International Search Report and Written Opinion of the International Searching Authority dated Sep. 12, 2018.
(Continued)

*Primary Examiner* — Jerry M Blevins
(74) *Attorney, Agent, or Firm* — Alston & Bird LLP

(57) ABSTRACT

An optical coupling structure is provided, an exemplary structure has a single-mode polymer waveguide terminated with a lens-shaped coupling structure on each end between an edge emitting laser chip and a single mode fiber. The edge emitting laser is assembled on the lower cladding layer of the waveguide front end with a gap filled with index matching structure, with multiple layers of different index materials for better matching efficiency. Another exemplary structure is a multiple channel polymer waveguide, developed for transmitting optical signals from edge emitting laser arrays to fiber arrays as well as to receive optical signals from fiber array to photodiode arrays. The multiple channel polymer waveguides are assembled with multiple channel connector to link to fiber cable. Multiple channel polymer waveguide cores are made to form angles with waveguide axial direction to compensate for the pitch difference between edge emitting laser channels and the single mode fibers in the fiber cable.

16 Claims, 5 Drawing Sheets

(51) Int. Cl.
*H04J 14/02* (2006.01)
*G02B 6/36* (2006.01)

(52) U.S. Cl.
CPC .............. *H04B 10/67* (2013.01); *H04J 14/02* (2013.01); *H05K 2201/10121* (2013.01)

(56) References Cited

U.S. PATENT DOCUMENTS

| | | | |
|---|---|---|---|
| 5,485,021 A | 1/1996 | Abe | |
| 6,036,956 A | 3/2000 | Jacob et al. | |
| 6,049,639 A | 4/2000 | Paniccia et al. | |
| 6,052,498 A | 4/2000 | Paniccia | |
| 6,243,508 B1 * | 6/2001 | Jewell | G02B 6/4206 385/14 |
| 6,393,169 B1 | 5/2002 | Paniccia et al. | |
| 6,403,393 B1 | 6/2002 | Adkisson et al. | |
| 6,456,765 B1 * | 9/2002 | Klocek | G02B 6/12004 385/42 |
| 6,549,708 B2 | 4/2003 | Worchesky et al. | |
| 6,587,605 B2 | 7/2003 | Paniccia et al. | |
| 6,731,856 B1 | 5/2004 | Fujita et al. | |
| 6,845,184 B1 | 1/2005 | Yoshimura et al. | |
| 7,218,809 B2 | 5/2007 | Zhou et al. | |
| 7,266,262 B2 | 9/2007 | Ogawa | |
| 7,627,204 B1 | 12/2009 | Deane | |
| 9,036,956 B2 | 5/2015 | Tseng et al. | |
| 9,086,551 B2 | 6/2015 | Heroux | |
| 9,341,797 B2 | 5/2016 | Nakagawa et al. | |
| 2001/0031109 A1 | 10/2001 | Paniccia et al. | |
| 2001/0038737 A1 | 11/2001 | Imada et al. | |
| 2002/0018507 A1 * | 2/2002 | Deacon | G02B 6/12007 372/96 |
| 2002/0028045 A1 | 3/2002 | Yoshimura et al. | |
| 2002/0036356 A1 | 3/2002 | Teshima | |
| 2002/0114587 A1 | 8/2002 | Golwalkar et al. | |
| 2003/0015770 A1 | 1/2003 | Talin et al. | |
| 2003/0223673 A1 | 12/2003 | Garito et al. | |
| 2004/0109654 A1 | 6/2004 | Feger et al. | |
| 2004/0264837 A1 | 12/2004 | Ogawa | |
| 2005/0031265 A1 | 2/2005 | Simon et al. | |
| 2005/0041906 A1 | 2/2005 | Sugama et al. | |
| 2005/0063636 A1 | 3/2005 | Joyner | |
| 2005/0185900 A1 * | 8/2005 | Farr | G02B 6/4206 385/93 |
| 2005/0201707 A1 | 9/2005 | Glebov | |
| 2006/0045418 A1 | 3/2006 | Cho et al. | |
| 2008/0031583 A1 | 2/2008 | Ohtsu et al. | |
| 2008/0037934 A1 * | 2/2008 | Daikuhara | G02B 6/3825 385/33 |
| 2009/0060526 A1 | 3/2009 | Matsui et al. | |
| 2009/0072393 A1 | 3/2009 | Bachman | |
| 2009/0202713 A1 * | 8/2009 | Pitwon | G02B 6/1221 427/163.2 |
| 2009/0218519 A1 | 9/2009 | McLeod | |
| 2010/0032853 A1 * | 2/2010 | Naitou | G02B 6/122 264/1.24 |
| 2010/0104290 A1 | 4/2010 | Nobuhara et al. | |
| 2010/0213561 A1 | 8/2010 | Assefa et al. | |
| 2010/0215313 A1 | 8/2010 | Matsuoka et al. | |
| 2010/0226655 A1 * | 9/2010 | Kim | G02B 6/4246 398/139 |
| 2011/0030778 A1 * | 2/2011 | Takacs | H01L 31/02168 136/256 |
| 2011/0133063 A1 | 6/2011 | Ji et al. | |
| 2012/0076454 A1 | 3/2012 | Shiraishi | |
| 2012/0177381 A1 | 7/2012 | Dobbelaere | |
| 2012/0314990 A1 | 12/2012 | Pitwon et al. | |
| 2013/0182998 A1 | 6/2013 | Andry et al. | |
| 2013/0223789 A1 | 8/2013 | Lee | |
| 2014/0112616 A1 | 4/2014 | Numata | |
| 2014/0140657 A1 | 5/2014 | Shiraishi | |
| 2014/0294342 A1 | 10/2014 | Offrein | |
| 2014/0321804 A1 | 10/2014 | Thacker et al. | |
| 2014/0355931 A1 | 12/2014 | Tummala et al. | |
| 2015/0117824 A1 | 4/2015 | Wang et al. | |
| 2015/0168646 A1 | 6/2015 | Arai | |
| 2015/0333831 A1 | 11/2015 | Lai et al. | |
| 2015/0362673 A1 | 12/2015 | Zheng et al. | |
| 2015/0362676 A1 | 12/2015 | Murison et al. | |
| 2016/0156999 A1 | 6/2016 | Liboiron-Ladouceur et al. | |
| 2016/0178839 A1 | 6/2016 | Tsujita | |
| 2017/0017042 A1 | 1/2017 | Menard et al. | |
| 2017/0230117 A1 | 8/2017 | Li et al. | |
| 2018/0149815 A1 * | 5/2018 | Heroux | G02B 6/4214 |

OTHER PUBLICATIONS

U.S. Appl. No. 15/963,030, Non-Final Office Action dated Oct. 17, 2017.
U.S. Appl. No. 15/963,665, Notice of Allowance dated Oct. 3, 2018.
U.S. Appl. No. 15/963,780, Non-Final Office Action dated Oct. 24, 2018.
U.S. Appl. No. 15/964,701, Non-Final Office Action dated Oct. 5, 2018.
WIPO Application No. PCT/US2018/031336, PCT International Search Report and Written Opinion of the International Searching Authority dated Sep. 19, 2018.
Chen et al., "Chip-Level 1 2 Optical Interconnects Using Polymer Vertical Splitter on Silieuri Substrate," IEEE Photonlcs Journal, 6:1-9 (2014).[ Retrieved from the Internet on Jun. 29, 2018 <URL:https://ieeexplore.ieee.org/stamp/stamp.jsp?tp=&arnumber=6746668>].
Shen et al., "Implementation of Chip-Level Optical Interconnect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/document/>].
U.S. Appl. No. 15/963,043 , Requirement for Restriction-Election dated Jun. 29, 2018.
U.S. Appl. No. 15/963,440 Requirement for Restriction-Election dated Jul. 10, 2018.
U.S. Appl. No. 15/963,780, Requirement for Restriction-Election dated Jul. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.

* cited by examiner

OPTICAL COUPLING STRUCTURES

CROSS REFERENCE TO RELATED APPLICATIONS

This application claims the benefit of U.S. Provisional Patent Applications No. 62/508,940, titled "OPTICAL COUPLING STRUCTURE" filed May 19, 2017, and No. 62/509,892, titled "OPTICAL INTERCONNECT MODULES" filed May 23, 2017, which are incorporated by reference herein in their entirety.

FIELD

Embodiments described herein relate to optical coupling structures, and more particularly for optical coupling to edge emitting diodes.

BACKGROUND

Cloud computing, enterprise networks, and data center networks continue to drive increased bandwidth demand of optical fiber communication for metro and long haul wires, and rack-to-rack wires within data centers to 100 Gbps and beyond. Optical fiber transmission systems using single mode fibers (SMFs) are commonly utilized for such high capacity communication systems. A common optical fiber transmission system includes a side (edge) emitting laser diode such as a distributed feedback (DFB) laser coupled with a single mode fiber. Various coupling structures have been proposed to increase coupling efficiency between a distributed feedback laser and a single mode fiber. Such commonly employed coupling structures include butt coupling (direct alignment of the optical paths of) the DFB laser with the SMF, or the integration of a cylindrical lens or combination of a cylindrical lens and graded index rod lens between the DFB and waveguide, and similarly between a waveguide and SMF. However these systems have their disadvantages of being bulky and high assembly cost. There is a need for a more compact and efficient device to replace current interconnect optical couplers.

SUMMARY

An optical coupling structure connecting a laser diode to a single mode fiber with a polymer waveguide is disclosed. An embodiment of the optical coupling structure includes a laser diode; a polymer waveguide which comprises a core structure made of a first polymer and a cladding structure made of a second polymer, a first end, a second end, and a first integrally formed lens at the first end, wherein the laser diode is aligned with the first integrally formed lens, a connector aligned with the second end of the polymer waveguide, and a single mode optical fiber aligned with the connector.

Optionally the laser diode is an edge emitting DFB laser chip.

Optionally the polymer waveguide is a single mode polymer waveguide.

Optionally the optical coupling structure further includes a first index matching structure between the edge emitting laser diode and the first end of the polymer waveguide, wherein the first index matching structure covers the first end of the polymer waveguide including the first integrally formed lens, wherein the first index matching structure optionally comprises multiple layers of materials each having a different refractive index.

Optionally the optical coupling structure further comprises a second integrally formed lens at the second end of the polymer waveguide.

The optical coupling structure further comprises a second index matching structure between the connector and the polymer waveguide, wherein the second index matching structure covers the second end of the polymer waveguide including the second integrally formed lens.

Optionally the first integrally formed lens maybe bulbous-shaped at the first end of the polymer core.

Optionally the cladding structure of the polymer waveguide may further comprise a bottom cladding layer and a top cladding layer, wherein the polymer waveguide's core structure is formed on the bottom cladding layer, and wherein the top cladding layer sits over and laterally around the core structure.

The bottom cladding layer includes a first bottom protrusion, and the top cladding layer includes a first top protrusion, and the first bottom and top protrusions are aligned with the first integrally formed lens at the first end of the polymer waveguide.

Another embodiment discloses a multiple channel optical coupling structure which comprises: a plurality of edge emitting laser diodes; a number of multi-channel polymer waveguides which include a plurality of polymer core structures made of a first polymer and a cladding structure encompassing the plurality of polymer core structures, the cladding structure is made of a second polymer ; a first end, a second end, and a plurality of first integrally formed lenses aligning to one of the core structures at the first end, where the plurality of laser diodes each is aligned with one of the plurality of first integrally formed lenses, therefore aligned to one of the core structures as well; a multiple channel connector aligned with the second end of one of the multiple channel polymer waveguides; and a plurality of single mode optical fibers assembled in a fiber ribbon and aligned with the multiple channel connector. As a result, each edge emitting laser is aligned to a designated single mode fiber end to end.

Optionally the plurality of laser diodes are edge emitting DFB laser chips.

Optionally the multiple channel polymer waveguides include a plurality of single mode polymer waveguides.

According to another embodiment of the disclosure, the multiple channel optical coupling structure further comprises a first index matching structure between the plurality of laser diodes and the first end of the multiple channel polymer waveguides, wherein the first index matching structure covers the first end of the multiple channel polymer waveguide including the plurality of the first integrally formed lens.

According to another embodiment of the disclosure, the multiple channel optical coupling structure further comprises a plurality of second integrally formed lenses at the second end of the multiple channel polymer waveguides, and a second index matching structure between the multiple channel connector and the multiple channel polymer waveguides, wherein the second index matching structure covers the second end of the multiple channel polymer waveguides including the plurality of second integrally formed lens.

According to another embodiment of the disclosure, in the multiple channel optical coupling structure, the plurality of core structures in the multiple channel polymer waveguides are arranged to form a plurality of angles with the waveguide axial line to compensate for the pitch difference between the laser channels and the single mode optical fibers in the fiber ribbon, the plurality of angles is a multiple of θ, where θ equals to the ratio of the pitch difference to the waveguide axial length.

According to one embodiment of the disclosure, a fabrication method is provided including a critical step: at first, the core structure of the polymer waveguide is patterned as a rib ridge on a flat surface of the bottom cladding layer by etching process, and then the top cladding layer is formed to encompass the core structure to form the buried channel waveguide.

According to another embodiment of the disclosure, another fabrication method is provided including a critical step: at first, the photo-sensitive polymer material is adopted as core structure of the polymer waveguide is patterned as a ridge on a flat surface of the bottom cladding layer by photolithography, and then the top cladding layer is formed to encompass the core structure to form the buried channel waveguide.

According to another embodiment of the disclosure, another fabrication method is provided including: a trench is first formed in the bottom cladding layer, the core structure is formed by filling the trench, and then the top cladding layer is formed covering the core structure in the trench. A polishing or etching step maybe required to remove excess core material outside the trench.

The active optical device may include a photodetector (PD) in the optical path in place of the illustrated DFB laser for applications as a receiver when light may enter the waveguide from the back end fiber and the photodetector is located at the front end after the lens and index matching material. Although a photodector is not shown in these figures, a reversed system having a photodector or a photodector array maybe similar as the active laser or laser array system described above.

BRIEF DESCRIPTION OF THE DRAWINGS

Having thus described some embodiments in general terms, reference will now be made to the accompanying drawings, which are not necessarily drawn to scale.

Figure 1:
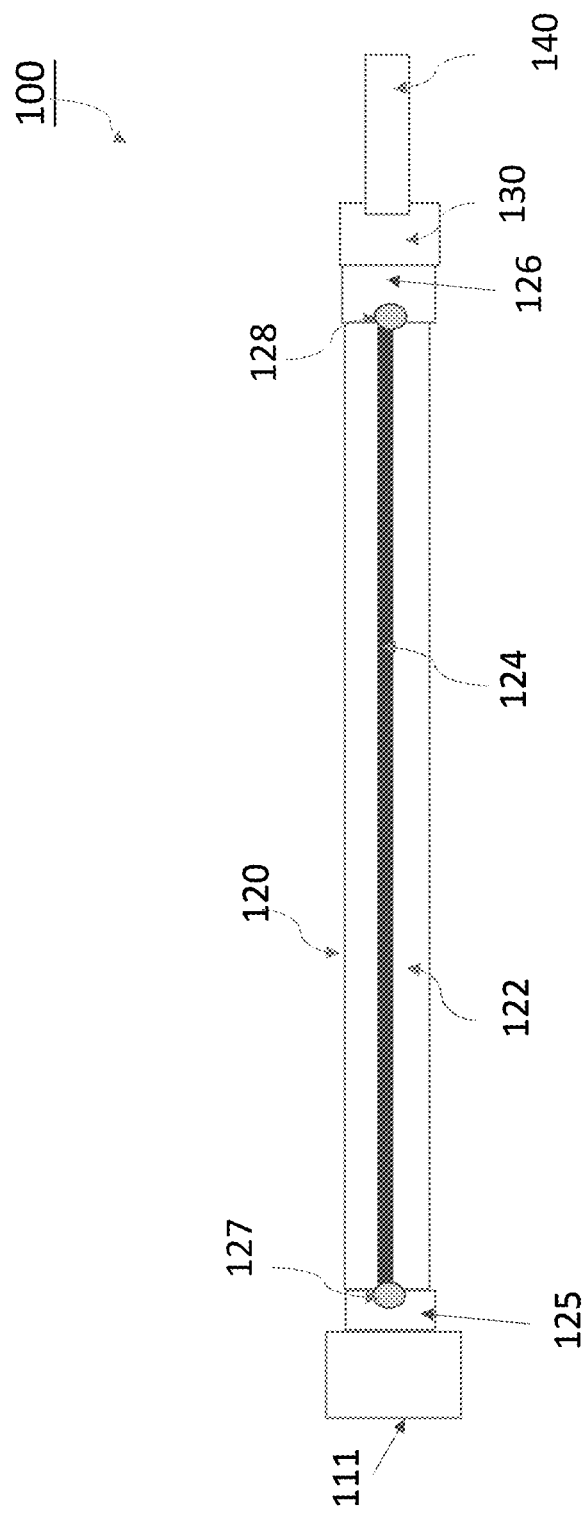

FIG. 1 is a schematic cross-sectional view illustration of an optical coupling structure integrating an edge emitting laser, a polymer waveguide, and a single mode fiber in accordance with an embodiment of the current disclosure.

Figure 2A:
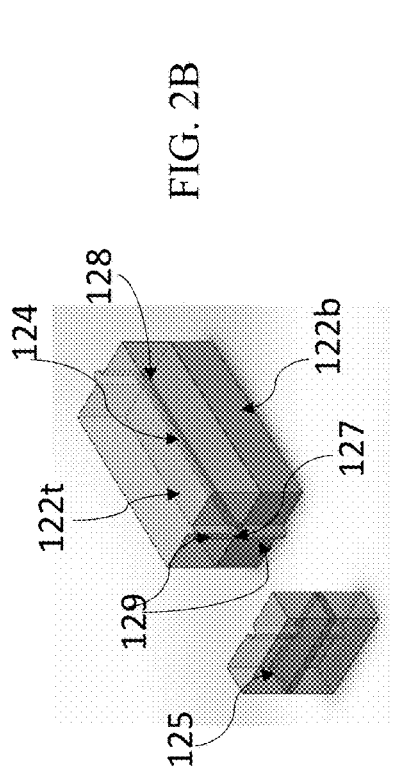

FIG. 2A is an isometric view illustration of a polymer waveguide in accordance with the embodiment disclosed in FIG. 1.

Figure 2B:
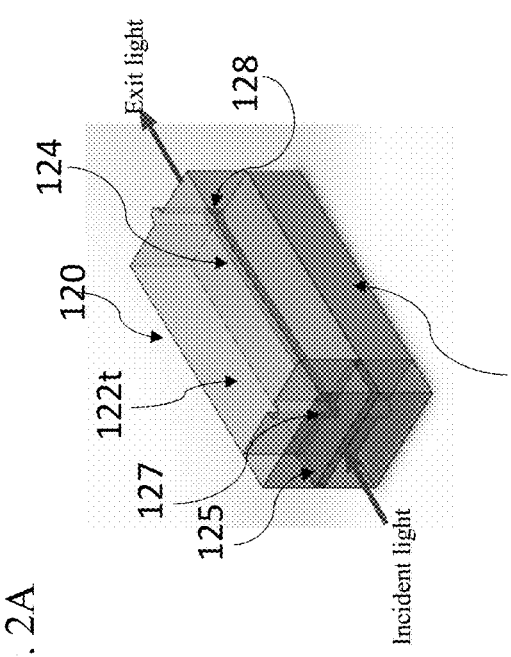

FIG. 2B is an exploded isometric view illustration of the polymer waveguide of FIG. 2A in accordance with the embodiment disclosed in FIG. 1.

Figure 2C:
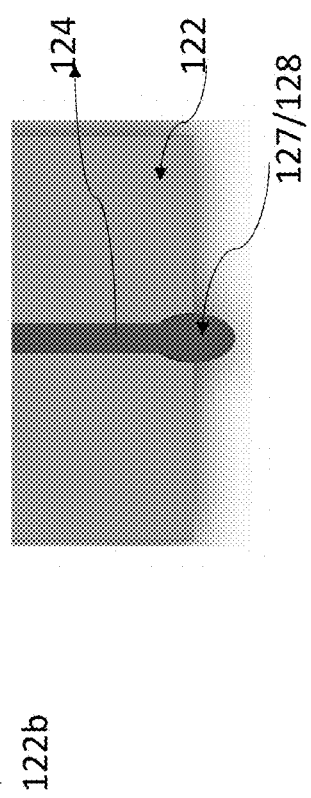

FIG. 2C is a schematic top view illustration of the integrally formed lens at the coupling interface of the waveguide core or waveguide cladding with laser or with single mode fiber, in accordance with the embodiment disclosed in FIG. 1.

Figure 3A:
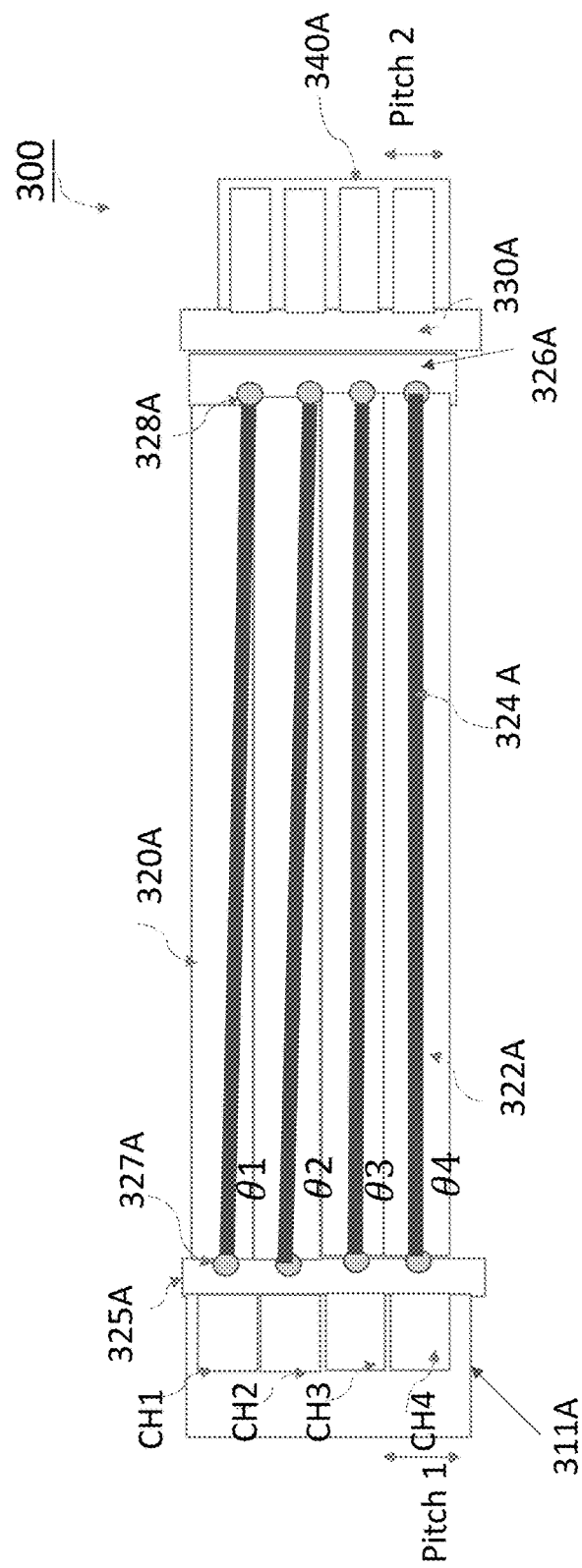

FIG. 3A is a schematic cross-sectional structure illustration of a multiple channel optical coupling structure in accordance with another embodiment of the present disclosure.

Figure 3B:
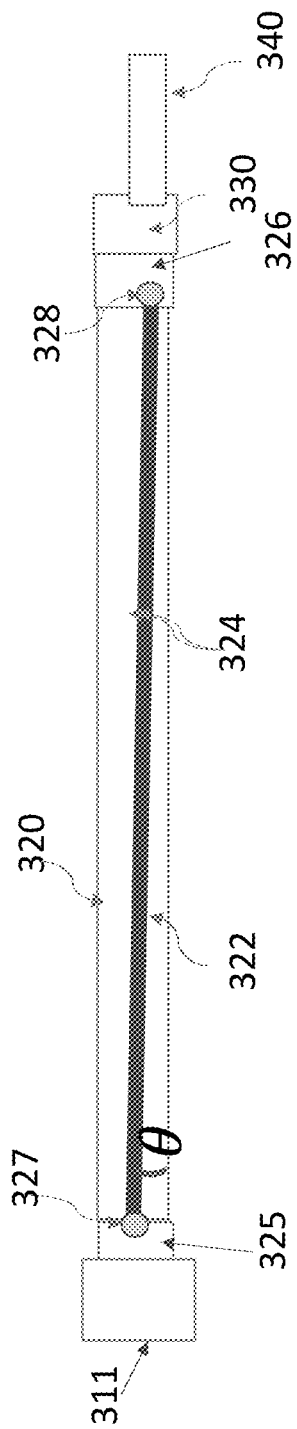

FIG. 3B is a schematic cross-sectional structure illustration of one channel of the multiple channel optical coupling structure in accordance with the embodiment disclosed in FIG. 3A.

Figure 4:
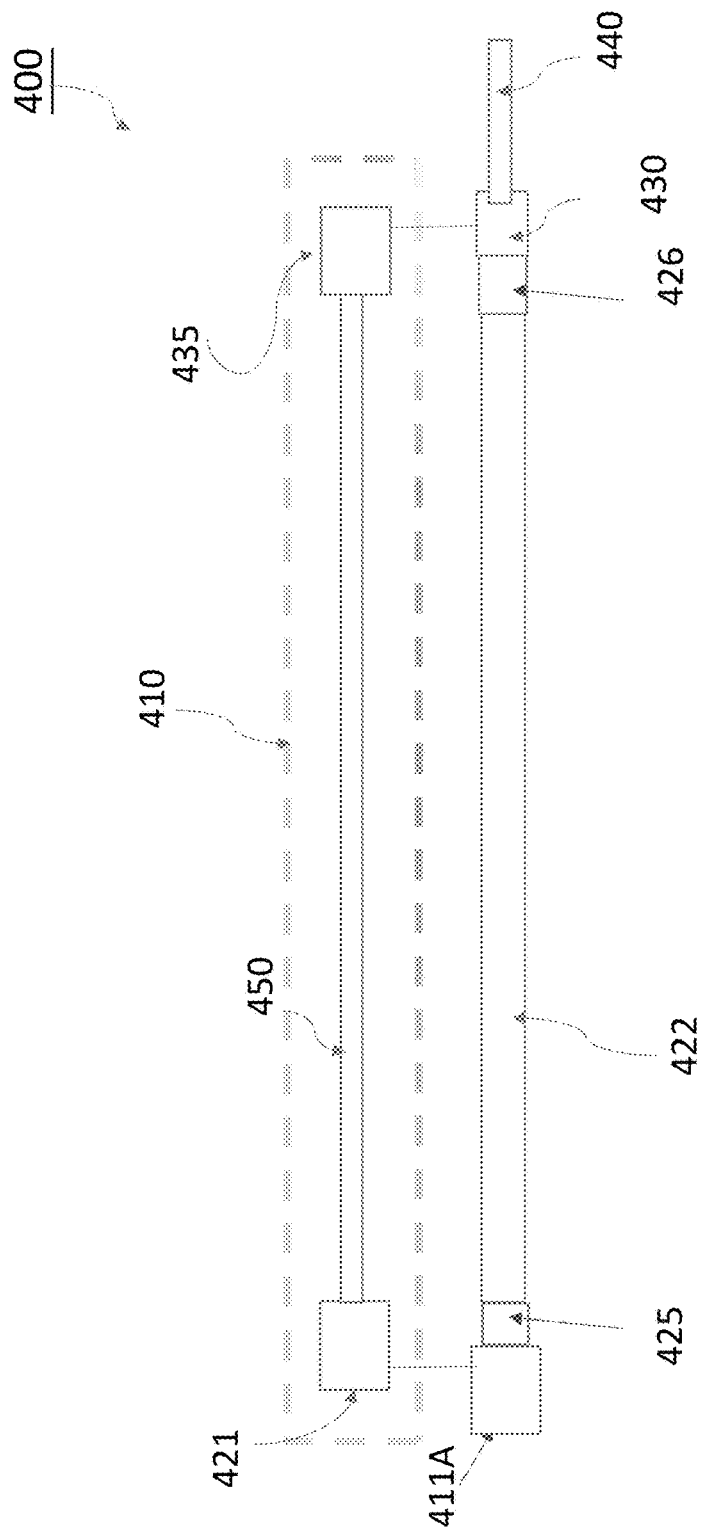

FIG. 4 is a schematic illustration of the accompanying electrical circuitry for an optical coupling structure in accordance with an embodiment of the present disclosure.

DETAILED DESCRIPTION

Embodiments described herein provide optical coupling structures from edge emitting laser diodes to single mode fibers joined by polymer waveguides. More particularly, embodiments describe polymer waveguides (PWGs) and flexible printed circuit (FPC) based optical coupling structures for optical coupling of laser diodes, such as DFB laser chips, to single mode fibers (SMFs). In one aspect, polymer waveguides in accordance with the present embodiments may include integrally formed micro-lens structures that are monolithically integrated with the polymer waveguides and may be fabricated simultaneously using patterning techniques widely used in semiconductor industry, such as photolithography and etch patterning. In this manner, the optical interconnect structures in accordance with current embodiments may improve the optical coupling efficiency between the laser diodes/photodetector and single mode fibers without additional external lenses for laser/polymer waveguide alignment, and fiber assembly. This may simplify the optical configuration of the coupling structure and reduce fabrication cost.

In another aspect, the polymer waveguide of the optical coupling structure may be coupled with a connector, for example, a mechanical transfer (MT) connector, also referred to as a PMT connector when connects with one end (the back end) of polymer waveguide, and links with a single mode fiber or multiple mode fibers in a multiple-channel optical coupling array device. Sometimes the optical coupling structures may be considered a part of a flexible printed circuit based system.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular details in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "spanning", "to", "between", and "on" as used herein may refer to a relative position of one layer with respect to other layers. One layer "over", "spanning", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a schematic cross-sectional view illustration is provided of an optical coupling structure connecting a distributed feedback laser to single mode fiber via a polymer waveguide in accordance with an embodiment. In accordance with the embodiments, the optical coupling structure may be integrated on a flexible printed circuit (FPC). Accordingly, the optical coupling structure may not include a single mode fiber, and instead be terminated with a connector, for example, like the mechanic transfer (PMT), designed to couple with one or more polymer waveguides.

As shown in FIG. 1, the optical coupling structure may include a polymer waveguide 100. A polymer waveguide is an optical transmission device made of polymer materials that guides strongly confined light in a core region, ranged in 3-30 microns, by total internal reflection. The polymer waveguide 100 in FIG. 1 has a polymer core region 124 surrounded by polymer cladding regions 122 which have a refractive index lower than that of the core region 124. The polymer core region may be a slab structure sandwiched between a top and a bottom cladding layers, or a strip structure which has a circular or a rectangular cross section surrounded by a cladding rod. A polymer core 124 is typically made of polymeric materials which exhibit relatively high dielectric constant (typically >2.5 I checked) such as polyimide, polystyrene, Mylar, and electroactive polymers, etc. A polymer cladding 122 is often made of lower dielectric constant (typically <2.4 I checked) polymer materials, for example, PTFE, Teflon, polyethylene, polypropylene, and electroactive polymers (with lower index of refraction). A polymer waveguide 100 has two ends, the front end connects to an active light source 111, which may include an edge emitting laser diode or a distributed feedback (DFB) laser typically (or a photodetector in a receiver device) via an integrally formed lens 127. The other end, or the back end, connects to a single mode fiber 140 directly or through a connector 130. Although it is optional, a second integrally formed lens 128 at the second end or back end of the polymer waveguide may improve coupling efficiency if necessarily required. If the polymer waveguide has a slab structure, top and bottom cladding layers and a core layer in between are formed into the slab structure. If the polymer waveguide has a strip structure, a high refractive index core maybe molded, or patterned into a ridge or a trench in the axial direction of the waveguide core inside the surrounding polymer cladding. An optical path of the edge emitting laser 111 such as a DFB laser is aligned with the first integrally formed lens 127 at the first or front end of the polymer waveguide 120, and a connector 130 such as a polymer mechanical transfer connector is aligned with the second or back end of the polymer waveguide 120, optionally through an integrally formed lens 128. An index matching material is filled into a front end structure 125 and a back end structure 126 between the front end of the polymer waveguide 120 and the laser diode/DFB laser 111, or between the back end of the polymer waveguide 120 and the connector 130. The front end lens 127 and the back end lens 128 are in direct contact with the index matching material in the index matching structures 125 and 126. In some cases, the lens 127 or 128 is integrally formed as an extension of the polymer core 124, so the index matching material embeds the outer surface of the lens 127/128. Similarly, the optical path may be aligned with a photodetector (not shown in FIG. 1) in place of the illustrated DFB laser for applications in a receiver when light may enter the waveguide from the back end fiber and the photodetector PD is located at the front end after the lens and index matching material. The active device such as DFB laser 111 or photodector may be assembled on the lower cladding layer in a slab structured polymer waveguide at the first or front end of the polymer waveguide, with a gap filled with an index matching material in structure 125. The connector 130 in turn may be coupled with a single mode fiber 140 when used, with the optical path exiting the polymer waveguide 120, aligned with the single mode fiber 140, optionally via a lens 128 and index matching structure 126 for better efficiency.

In an embodiment, a first index matching structure 125 at the first or front end of the polymer waveguide 120 may be formed between the edge emitting laser diode or a DFB laser 111 or a photodetector (not shown in FIG. 1) and the polymer waveguide 120. The first index matching structure 125 then covers the first end of the polymer waveguide including the first integrally formed lens 127. The first index matching structure 125 may include one or more materials into multiple layers, although typically three layers. The goal of the refractive index matching is to optimize the light transmission between the material forming the edge emitting laser diode, like a DFB laser 111, and the material forming the waveguide core 124 so the matching is gradual, or step-wise from multiple materials. The same technique is also applied to the back end index matching structure 126.

In accordance with embodiments, optionally, a second integrally formed lens 128 may also be formed at the second end or the back end of the polymer waveguide 120. Similarly, the second integrally formed lens 128 may be integrally formed with the polymer core 124. Additionally, a second index matching structure 126 may be located between the connector 130 and the back end of the polymer waveguide 120. The second index matching structure 126 covers the second end of the polymer waveguide 120 including the external surface of the second integrally formed lens 128.

In exemplary embodiments, the index matching structures 125/126 may be designed as one-layered structures with one refractive index or multiple layered structure with more than one materials having more than one refractive indices, typically a three-layered structure with at least two reflective indices is quite common, for example, one material may match to the index of core structure 124 and another material may match to the index of cladding structure 122.

Referring now to FIG. 2A, an isometric view illustration is provided of the polymer waveguide 120 in accordance with the embodiment disclosed in FIG. 1. FIG. 2B is an exploded isometric view illustration of the polymer waveguide of FIG. 2A, while FIG. 2C is a schematic top view illustration of the waveguide core and waveguide cladding of the polymer waveguide of FIG. 2A in accordance with the embodiment. As shown the polymer waveguide 120 may include a core part 124 having a first end and a second end. A first integrally formed lens 127 may be at the first end of the core structure 124, while a second integrally formed lens 128 may be at the second end of the core structure 124. In the particular embodiments illustrated in FIGS. 2A-2C, the integrally formed lenses 127/128 may be an extension of the core structure and are bulbous-shaped. In an embodiment shown in FIG. 2C, the core structure 124 may have a width along the optical path that is narrower than the bulbous-shaped lens 127/128. The bulbous-shaped lens may have a circular or cylindrical cross section in an embodiment, though this is not required.

The polymer waveguide 120 may be formed from a plurality of layers. In an embodiment, the polymer waveguide 120 includes a bottom cladding layer 122b, the core structure 124 on the bottom cladding layer 122b, and a top cladding layer 122t over and laterally around the core structure 124. For example, the bottom cladding layer 122b may be formed first, followed by deposition and patterning of the core structure 124 over the bottom cladding layer 122b. In an embodiment, the core structure 124 has a flat top surface adjacent to the top cladding layer 122t and a flat bottom surface adjacent to the bottom cladding layer 122*b*. After patterning the core structure 124, the top cladding layer 122*t* may be formed over the patterned core structure 124 and the bottom cladding layer 122*b*. The bottom cladding layer 122*b*, core structure 124, and top cladding layer 122*t* may then be patterned together, for example using a lithography—dry etching technique, to form first (front where incident light comes) and second (back where light exits) edges (or surfaces) of the polymer waveguide 120.

FIG. 2B is an exploded 3D view of the polymer waveguide in particular, the bottom cladding layer 122*b* includes a first bottom protrusion 129, and the top cladding layer 122*t* includes a first top protrusion 129, both of which are aligned with the first integrally formed lens 127 along the first edge. In an embodiment, the first bottom protrusion and the first top protrusion 129 along the first edge may have a half-cylinder shape. As shown in FIG. 2C, the half-cylindrical shape may be only attributed to a portion of the bulbous-shaped lens 127/128 spanning along the first edge, with other portions contained within an interior of the polymer waveguide 120.

(Eric, please verify if the process I described here out of my understanding is correct. Correct it if not) The polymer cladding layer 122*t* may be deposited in a core-first deposition process around laterally and over the polymer core structure 124, when the polymer core material is first deposited as a layer and patterned as a rib over a flat bottom cladding layer 122*b*. It can also be deposited in two separate deposition steps in a cladding trench first process, by first depositing the bottom cladding layer 122*b* and preparing a trench to fill it with core structure 124, and then perform a second deposition on the bottom cladding layer 122*b* to cover the core structure 124. The second trench first process may require a planarization process to remove core material outside the trench area after depositing the cladding.

Similarly to the protrusions 129, the bottom cladding layer 122*b* may also include a second bottom protrusion, and the top cladding layer include a second top protrusion, both of which are aligned with the second integrally formed lens 128 along the second edge. In an embodiment, the second bottom protrusion and the second top protrusion along the second edge have a half-cylindrical shape. Neither of the second protrusions is shown in FIG. 2A-2C because of their similarities to the protrusions 129.

In accordance with the embodiments, index matching structures 125 and 126 (126 is not shown here) may be formed at the first and second edges of the polymer waveguide. The index matching materials in index matching structure 125/126 is formed encompassing the lens 127/128. The index matching structures may facilitate matching of the indices of refraction of adjacent layers used in butt-joint coupling techniques, in which the optical paths of the adjacent layers are aligned seamlessly. While only a single index matching structure is illustrated in FIGS. 2A-2B, it is understood that a second index matching structure can also be formed on the opposite edge of the polymer waveguide. In an embodiment, a first index matching structure is formed on the first edge of the polymer waveguide 120 spanning the bottom cladding layer 122*b*, the top cladding layer 122*t* and the core structure 124 including the first bottom protrusion 129, the first integrally formed lens 127, and the first top protrusion 129. In an embodiment, a second index matching structure is formed on the second edge of the polymer waveguide 120 spanning the bottom cladding layer 122*b*, the top cladding layer 122*t* and the core structure including the second bottom protrusion, the second integrally formed lens 128, and the second top protrusion. In exemplary embodiments, the index matching structures may include one or more materials having at least two different refractive indices in typically three layers. The specific embodiments illustrated include three layers, aligned with the bottom cladding layer 122*b*, core structure 124, and top cladding layer 122*t*, respectively, to provide specific index matching to the core layer and cladding structure. Please noted that in FIG. 2A and 2B, the index matching structure 125 has a slab shape much wider than the integrally formed lens 127, the width of the index matching structure 125 may be just enough to surround the outer surface of lens 127 for proper light transmission efficiency.

Although the integrally formed lenses 127 and 128 shown in FIGS. 2A-2C are an extension of the polymer core structure 124, a coupling lens does not have to be formed as part of the polymer core. In another embodiment, the coupling lens maybe a structure fabricated separately from the polymer core 124 in an integrally formed process, which may include separate deposition and patterning processes.

In accordance with embodiments, the optical coupling structure for one channel may include one or more optical channels, and a connector (e.g. PMT connector) to link with one or more single mode fibers (SMFs) in a single-channel or multiple-channel configuration. FIG. 3A is a schematic cross-sectional top view illustration of a multiple channel (CH) optical coupling structure 300 in accordance with an embodiment. FIG. 3B is a schematic cross-sectional top view illustration of a single channel (CH) optical coupling structure which illustrates one channel of the multiple channel optical coupling structure in FIG. 3A.

FIG. 3A shows a top view of a multiple channel optical coupler system 300 employing polymer waveguides. This system 300 includes a laser diode or a DFB laser array 311A, a polymer waveguide array 320A, a connector array 330A, and a single mode fiber bundle array 340A. The polymer waveguide array 320A includes a multiple core structure array 324A defining multiple optical paths formed in a cladding array 322A. As described for FIGS. 2A-2C, the cladding array may have a bottom piece and a top piece, fabricated in a variety of ways to encompass the polymer core array inside the cladding material 322A. In addition, a multiple channel optical coupling structure 320A further includes a plurality of first integrally formed lenses array 327A at the first (or front) end of the polymer waveguide array 320A, to align with the edge emitting diode array or DFB laser array 311A. In a multiple channel receiver system, a photodetector array may replace the laser array 311A. The connector array 330A (e.g. PMT connectors) is designed to couple with a plurality of single mode fiber array 340A. Similar to a single channel polymer waveguide, index matching materials in index matching structures 325A/326A are formed encompassing the front end lens array 327A and back end lens array 328A. The index matching structures may facilitate matching of the indices of refraction of adjacent layers used in butt-joint coupling techniques, in which the optical paths of adjacent layers in the multiple channels are aligned seamlessly.

In an exemplary embodiment, the optical coupling system 300 is a four-channel structure, including four DFB lasers assembled in a DFB laser array 311A and four optical paths to connect with single fibers assembled in a single mode fiber bundle array 340A.

Accordingly, the structure array may be formed similarly as described with regard to FIGS. 2A-2C, with the addition of patterning multiple core structures and multiple lenses. The index matching structures may be similarly formed.

The multi-channel polymer waveguides in accordance with embodiments may thus transmit optical signals from DFB laser to fiber arrays, as well as to receive optical signals from fiber to photodetector arrays. Such multi-channel polymer waveguides may be assembled with a multi-channel PMT connector to link with a fiber bundle array or a ribbon cable.

In an embodiment, the laser diodes or DFB laser arrays have a typical laser-to-laser pitch 1, which is larger than 250 µm, and the single mode fiber ribbon cable has a typical fiber-to-fiber pitch 2 at 250 µm, causing a slight misalignment if the multiple core structures are made parallel to each other. Therefore, a tilt angle (θ) is introduced to offset the waveguide cores. For example, θ1=3θ, θ2=2θ, θ3=θ, and θ4=0°. The tilt angle θ equals to $\tan^{-1}$ (50µm/L) while L is the total axial length of the waveguide.

In another embodiment, multiple waveguides maybe slightly bent to accommodate the waveguide core positioning.

FIG. 3B illustrates one channel among the multiple channels in the optical coupling structure in accordance with the embodiment disclosed in FIG. 3A. The optical coupler includes a laser diode or DFB laser 311, laser light signal is coupled into a polymer waveguide 320 through a lens 327 and an index matching material 325. Polymer cladding 322 and polymer core structure 324 guide the laser light signal to the exit end lens 328 and encompassing index matching material 326, via the connector 330 (e.g. PMT connector) the transmitted light enters a single mode fiber 340. A tilt angle (θ) is built into the polymer core structure to compensate the pitch difference of the standard laser channels and the standard fiber ribbon channels in a multiple channel optical coupler system.

Referring to FIG. 4, electrical form factor 410, maybe a flexible printed circuit (FPC) board based device mounted nearby the polymer waveguide. The FPC device supports a number of high-speed electrical traces (transmission line) 450, RF transmission lines, a driver IC 421 connects to the laser diode or DFB laser array 411A or a photodiode array (not shown), a receiver IC 435 (e.g. trans-impedance amplifier) which connects to the mechanical transport connector 430. Exemplary data rates of the optical coupling structures described herein may be at 25 Giga-bits per second (Gbps) per channel and can be extended to a higher, such as 50 Gbps per channel.

In utilizing the various aspects of the embodiments, it would become apparent to one skilled in the art that combinations or variations of the above embodiments are possible for fabricating optical coupling structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical coupling structure comprising:
    a laser diode;
    a polymer waveguide comprising a core structure made of a first polymer and a cladding structure made of a second polymer, a first end, a second end, and a first integrally formed lens at the first end, wherein the laser diode is aligned with the first integrally formed lens;
    a connector aligned with the second end of the polymer waveguide; and
    a single mode optical fiber aligned with the connector;
    wherein the cladding structure of the polymer waveguide further comprises a bottom cladding layer and a top cladding layer, wherein the core structure is formed on the bottom cladding layer, and wherein the top cladding layer sits over and laterally around the core structure;
    wherein the bottom cladding layer includes a first bottom protrusion, and the top cladding layer includes a first top protrusion, and the first bottom and top protrusions are aligned with the first integrally formed lens.

2. The optical coupling structure in claim 1, wherein the edge emitting laser is a Distributed Feedback(DFB) laser.

3. The optical coupling structure of claim 1, further comprising a first index matching structure between the laser diode and the first end of the polymer waveguide, wherein the first index matching structure covers the first end of the polymer waveguide including the first integrally formed lens.

4. The optical coupling structure of claim 3, wherein the first index matching structure comprises multiple layers of materials each having a different index.

5. The optical coupling structure of claim 1, further comprising a second integrally formed lens at the second end of the polymer waveguide.

6. The optical coupling structure of claim 5, further comprising a second index matching structure between the connector and the polymer waveguide, wherein the second index matching structure covers the second end of the polymer waveguide including the second integrally formed lens.

7. The optical coupling structure of claim 1, wherein the first integrally formed lens is convex-shaped.

8. A multiple channel optical coupling structure comprising:
    a plurality of laser diodes;
    a multiple channel polymer waveguide comprising a plurality of core structures made of a first polymer and a cladding structure made of a second polymer, a first end, a second end, and a plurality of first integrally formed lenses at the first end, wherein the plurality of laser diodes each is aligned with one of the plurality of first integrally formed lenses;
    a multiple channel connector aligned with the second end of the multiple channel polymer waveguide; and
    a plurality of single mode optical fibers assembled in a fiber cable and aligned with the multiple channel connector;
    wherein the plurality of core structures in the multiple channel polymer waveguide is arranged to form a plurality of angles with a waveguide axial line to compensate a pitch difference between laser channels and the single mode optical fibers in the fiber cable, wherein the plurality of angles is a multiple of θ(θ=pitch difference/waveguide length).

9. The multiple channel optical coupling structure of claim 8, wherein the plurality of edge emitting lasers each is a Distributed Feedback(DFB) laser.

10. The multiple channel optical coupling structure in claim 8, wherein the multiple channel polymer waveguide includes a plurality of single mode or multimode polymer waveguides.

11. The multiple channel optical coupling structure of claim 8, further comprising a first index matching structure between the plurality of laser diodes and the first end of the multiple channel polymer waveguide, wherein the first index matching structure covers the first end of the multiple channel polymer waveguide including the plurality of first integrally formed lens.

12. The multiple channel optical coupling structure of claim 8, further comprising a plurality of second integrally formed lenses at the second end of the multiple channel polymer waveguide.

13. The multiple channel optical coupling structure of claim 12, further comprising a second index matching structure between the multiple channel connector and the multiple channel polymer waveguide, wherein the second index matching structure covers the second end of the multiple channel polymer waveguide including the plurality of second integrally formed lens.

14. A method of forming the optical coupling structure of claim 8, wherein the core structure of the polymer waveguide is patterned as a line structure on a flat surface of a bottom cladding layer first and a top cladding layer is formed covering the core structure.

15. A method of forming the optical coupling structure of claim 8, wherein a trench is first formed in a bottom cladding layer, the core structure is formed filling the trench, and a top cladding layer is formed covering the core structure.

16. A method of forming the optical coupling structure of claim 15, further comprising a planarizing process to remove excess core structure outside the trench on the bottom cladding layer.

* * * * *